(12) United States Patent
Reinschmidt

(10) Patent No.: US 7,274,209 B1
(45) Date of Patent: Sep. 25, 2007

(54) LOW VOLTAGE TO HIGH VOLTAGE SIGNAL LEVEL TRANSLATOR WITH IMPROVED PERFORMANCE

(75) Inventor: Robert M. Reinschmidt, Hollis, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/876,944

(22) Filed: Jun. 25, 2004

Related U.S. Application Data

(60) Provisional application No. 60/483,574, filed on Jun. 26, 2003.

(51) Int. Cl.
*H03K 19/094* (2006.01)
(52) U.S. Cl. ....................................................... 326/38
(58) Field of Classification Search ................. 326/68, 326/80, 81, 38; 327/333
See application file for complete search history.

(56) References Cited

U.S. PATENT DOCUMENTS

| | | | | |
|---|---|---|---|---|
| 4,978,870 A * | 12/1990 | Chen et al. | ................... | 326/68 |
| 4,978,905 A | 12/1990 | Hoff et al. | ................... | 323/313 |
| 5,157,282 A | 10/1992 | Ong et al. | ................... | 327/333 |
| 5,502,405 A | 3/1996 | Williams | ..................... | 326/71 |
| 5,510,731 A * | 4/1996 | Dingwall | ..................... | 326/63 |
| 5,600,267 A | 2/1997 | Wong et al. | ................. | 323/313 |
| 5,691,654 A | 11/1997 | Green et al. | ................ | 327/362 |
| 5,745,354 A | 4/1998 | Raza | .......................... | 327/536 |
| 5,821,799 A | 10/1998 | Saripella | .................... | 327/333 |
| 5,872,464 A | 2/1999 | Gradinariu | ................. | 323/313 |
| 5,903,142 A | 5/1999 | Mann | ......................... | 327/362 |
| 5,952,868 A | 9/1999 | Gowni et al. | ............... | 327/536 |
| 5,973,545 A | 10/1999 | Raza | .......................... | 327/333 |
| 6,011,421 A | 1/2000 | Jung | .......................... | 327/333 |
| 6,191,636 B1 | 2/2001 | Cress et al. | ................... | 326/66 |
| 6,307,398 B2 * | 10/2001 | Merritt et al. | ................ | 326/81 |
| 6,307,498 B1 * | 10/2001 | Eglit | .......................... | 341/155 |
| 6,323,683 B1 | 11/2001 | Katikaneni | ................... | 326/81 |
| 6,362,652 B1 | 3/2002 | Oner | .......................... | 326/81 |
| 6,366,124 B1 | 4/2002 | Kwong | ....................... | 365/205 |
| 6,370,071 B1 | 4/2002 | Lall et al. | .................... | 326/83 |
| 6,377,075 B1 | 4/2002 | Wong | ......................... | 326/215 |
| 6,392,440 B2 | 5/2002 | Nebel | ......................... | 326/119 |
| 6,404,229 B1 | 6/2002 | Barnes | ........................ | 326/68 |
| 6,407,579 B1 | 6/2002 | Goswick | ...................... | 326/81 |
| 6,429,716 B1 | 8/2002 | Drapkin | ...................... | 327/333 |
| 6,445,622 B1 * | 9/2002 | Hirano | .................. | 365/189.11 |

(Continued)

*Primary Examiner*—Peguy JeanPierre
(74) *Attorney, Agent, or Firm*—Brownstein Hyatt Farber Schreck, P.C.

(57) ABSTRACT

A circuit for shifting a signal from a first voltage level to a second voltage level. In one embodiment, a voltage translator circuit has first and second transistors that are cross-coupled; a third transistor having a gate coupled with the input signal, the third transistor being coupled between the gate of the second cross-coupled transistor and the drain of the first cross-coupled transistor; and a fourth transistor having a gate coupled with an inverted version of the input signal, the fourth transistor being coupled between the gate of the first cross-coupled transistor and the drain of the second cross-coupled transistor. In another embodiment, the circuit may have, as part of its output stage, a first and second output transistors connected in series, and a third output transistor coupled between the second output transistor and ground, the third output transistor having a gate coupled with a high voltage supply.

8 Claims, 2 Drawing Sheets

U.S. PATENT DOCUMENTS

| | | | |
|---|---|---|---|
| 6,518,818 B1 | 2/2003 | Hynes | 327/333 |
| 6,580,291 B1 | 6/2003 | Lutley | 326/81 |
| 6,590,420 B1 | 7/2003 | Mnich et al. | 326/68 |
| 6,768,352 B1 | 7/2004 | Maher et al. | 327/112 |
| 6,842,043 B1 * | 1/2005 | Nguyen et al. | 326/68 |
| 6,864,718 B2 * | 3/2005 | Yu | 326/68 |
| 7,071,730 B2 * | 7/2006 | Cordoba | 326/38 |

* cited by examiner

LOW VOLTAGE TO HIGH VOLTAGE SIGNAL LEVEL TRANSLATOR WITH IMPROVED PERFORMANCE

CROSS REFERENCE TO RELATED APPLICATION

This application claims priority under 35 U.S.C. 119(e) to U.S. Provisional Patent Application No. 60/483,574 entitled "LOW VOLTAGE TO HIGH VOLTAGE SIGNAL LEVEL TRANSLATOR WITH IMPROVED PERFORMANCE" filed Jun. 26, 2003, the disclosure of which is hereby incorporated by reference in its entirety.

FIELD OF THE INVENTION

This invention relates to level shifting or voltage translating circuits.

BACKGROUND OF THE INVENTION

A level shifting circuit, also known as a voltage translator circuit, is used to shift the voltage levels of logic signals to higher voltages. For example, in a circuit where the logic levels are 0 volts for a "low" logic level and +1.2 volts for a "high" logic level, a level shifting circuit can be used so that those logic levels are 0 volts for the "low" logic level and +3.3 volts for the "high" logic level, in one example.

In one application, a translator circuit may be used to translate CMOS signal levels on a low power supply (i.e., internal levels from the core of a semiconductor device) to a higher power supply (i.e., I/O levels).

FIG. 1 illustrates an example of a level shifting circuit 10 which shifts the voltage levels of a logic signal 12 to a higher voltage level at output 14. In this example, a pair of p-channel transistors Q1, Q2 are employed with their sources connected to a high voltage supply 16 and their gates/drains cross coupled in a positive feedback configuration. Cross-coupled nodes 18, 20 are also connected to a pair of n-channel pull down transistors Q3, Q4. The pull down transistors Q3, Q4 will force one side or the other side of Q1/Q2 low while the cross coupling will force the opposite side of Q1/Q2 high, such as writing a soft latch. The signal levels at the gates of Q3 and Q4 are low voltage. The signal level at the cross-coupled nodes 18, 20 are high voltage thus accomplishing the translation or level shifting function.

In FIG. 1, the output stage includes an n-channel pull-down transistor Q8 driven by a low voltage signal 22 and a p-channel pull-up transistor Q7 driven by a high voltage signal 24. This stage is used to increase drive strength and to help balance rise and fall delays.

As recognized by the present inventor, the circuit 10 of FIG. 1 may be characterized by slow response times. Further, the transistors may need to be sized such that the n-channel transistors are relatively large so they can force the circuit to the opposite state over process, temperature, voltage variations/corners. The much weaker p-channel transistors may present relatively slow rise times, may create large propagation delay and duty cycle distortion, and may skew the output signal 14.

As recognized by the present inventor, what is needed is a circuit for shifting the voltage levels of an input signal to higher voltage levels, while reducing the rise time and delay associated with the level shifting circuit.

It is against this background that various embodiments of the present invention were developed.

SUMMARY

In light of the above and according to one broad aspect of one embodiment of the invention, disclosed herein is a circuit for shifting a signal from a first voltage level to a second voltage level. In one embodiment, a voltage translator circuit has first and second transistors that are cross-coupled; a third transistor having a gate coupled with the input signal, the third transistor being coupled between the gate of the second cross-coupled transistor and the drain of the first cross-coupled transistor; and a fourth transistor having a gate coupled with an inverted version of the input signal, the fourth transistor being coupled between the gate of the first cross-coupled transistor and the drain of the second cross-coupled transistor.

In another embodiment, the circuit may have, as part of its output stage, a first and second output transistors connected in series, and a third output transistor coupled between the second output transistor and ground, the third output transistor having a gate coupled with a high voltage supply.

According to another broad aspect of an embodiment of the present invention, disclosed herein is a circuit for shifting an input signal from a first voltage level to a second voltage level. In one example, the circuit may include a first and a second transistor (Q1, Q2) that are cross-coupled; a third transistor (Q9) having a gate coupled with the input signal, the third transistor being coupled between a gate of the second transistor (Q2) and a drain of the first transistor (Q1); a fourth transistor (Q10) having a gate coupled with an inverted version of the input signal, the fourth transistor being coupled between a gate of the first transistor (Q1) and a drain of the second transistor (Q2); a fifth transistor (Q3) coupled in series with the third transistor (Q9), the fifth transistor having a gate coupled with the gate of the third transistor; and a sixth transistor (Q4) coupled in series with the fourth transistor (Q10), the sixth transistor having a gate coupled with the gate of the fourth transistor.

In one embodiment, the first transistor is a p-channel transistor; the second transistor is a p-channel transistor; the third transistor is a p-channel transistor; the fourth transistor is a p-channel transistor; the fifth transistor is a n-channel transistor; and the sixth transistor is a n-channel transistor.

In another example, the circuit may include an output stage having a seventh transistor (Q7) coupled with a high voltage supply and having a gate coupled with the gate of the second transistor; an eighth transistor (Q8) connected in series with the seventh transistor, the eighth transistor having a gate coupled with coupled with the forth transistor; and a ninth transistor (Q11) connected in series with the eighth transistor, the ninth transistor having a gate coupled with the high voltage supply. The eighth and ninth transistors may be n-channel transistors.

According to another broad aspect of another embodiment of the present invention, disclosed herein is a level shifting circuit for shifting an input signal from a first voltage level to a second voltage level. In one example, the level shifting circuit includes a latch receiving the input signal and providing an output signal, and an output stage receiving the output signal of the latch, the output stage including at least three transistors in series. The at least three transistors in series may include a p-channel transistor coupled with a high voltage supply, a first n-channel transistor coupled in series with the p-channel transistor, and a second n-channel transistor connected in series with the first n-channel transistor. In one example, the second n-channel transistor is biased with the high voltage supply.

In another example, the latch may include a first and a second transistor (Q1, Q2) that are cross-coupled; a third transistor (Q9) having a gate coupled with the input signal, the third transistor being coupled between a gate of the second transistor (Q2) and a drain of the first transistor (Q1); a fourth transistor (Q10) having a gate coupled with an inverted version of the input signal, the fourth transistor being coupled between a gate of the first transistor (Q1) and a drain of the second transistor (Q2); a fifth transistor (Q3) coupled in series with the third transistor (Q9), the fifth transistor having a gate coupled with the gate of the third transistor; and a sixth transistor (Q4) coupled in series with the fourth transistor (Q10), the sixth transistor having a gate coupled with the gate of the fourth transistor. In this example, the first transistor may be a p-channel transistor, the second transistor a p-channel transistor, the third transistor a p-channel transistor, the fourth transistor a p-channel transistor, the fifth transistor a n-channel transistor, and the sixth transistor a n-channel transistor.

According to another broad aspect of another embodiment of the present invention, disclosed herein is a level shifting circuit for shifting an input signal from a first voltage level to a second voltage level. In one example, the level shifting circuit includes a latch receiving the input signal and providing an output signal, the latch including at least six transistors, and an output stage receiving the output signal of the latch.

In one example, the latch includes a first and a second transistor (Q1, Q2) that are cross-coupled; a third transistor (Q9) having a gate coupled with the input signal, the third transistor being coupled between a gate of the second transistor (Q2) and a drain of the first transistor (Q1); a fourth transistor (Q10) having a gate coupled with an inverted version of the input signal, the fourth transistor being coupled between a gate of the first transistor (Q1) and a drain of the second transistor (Q2); a fifth transistor (Q3) coupled in series with the third transistor (Q9), the fifth transistor having a gate coupled with the gate of the third transistor; and a sixth transistor (Q4) coupled in series with the fourth transistor (Q10), the sixth transistor having a gate coupled with the gate of the fourth transistor.

In another embodiment, the output stage may include at least three transistors in series, comprising a p-channel transistor coupled with a high voltage supply, a first n-channel transistor coupled in series with the p-channel transistor, and a second n-channel transistor connected in series with the first n-channel transistor.

The features, utilities and advantages of the various embodiments of the invention will be apparent from the following more particular description of embodiments of the invention as illustrated in the accompanying drawings.

DETAILED DESCRIPTION

Disclosed herein are various embodiments of circuits for shifting or translating a signal from a first voltage level to a second voltage level. In one example, the first voltage level can be approximately 0 volts or +1.2 volts, representing logic low and logic high, respectively, and the second voltage level may be approximately 0 volts to +3.3 volts, in one example, representing logic low and logic high, respectively. The particular voltage levels representing logic high or logic low discussed herein are provided as examples only, and it is understood that other voltage levels may be used depending upon the particular implementation of an embodiment of the present invention.

As will be explained below, embodiments of the present invention provide the level shifting/voltage translating function while reducing delay and rise time of the circuit. Various embodiments of the present invention will now be described.

As used herein, the term "transistor" or "switch" includes, but is not limited to, any switching element which can include, for example, n-channel or p-channel CMOS transistors, MOS-FETs, FETs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

Figure 2:
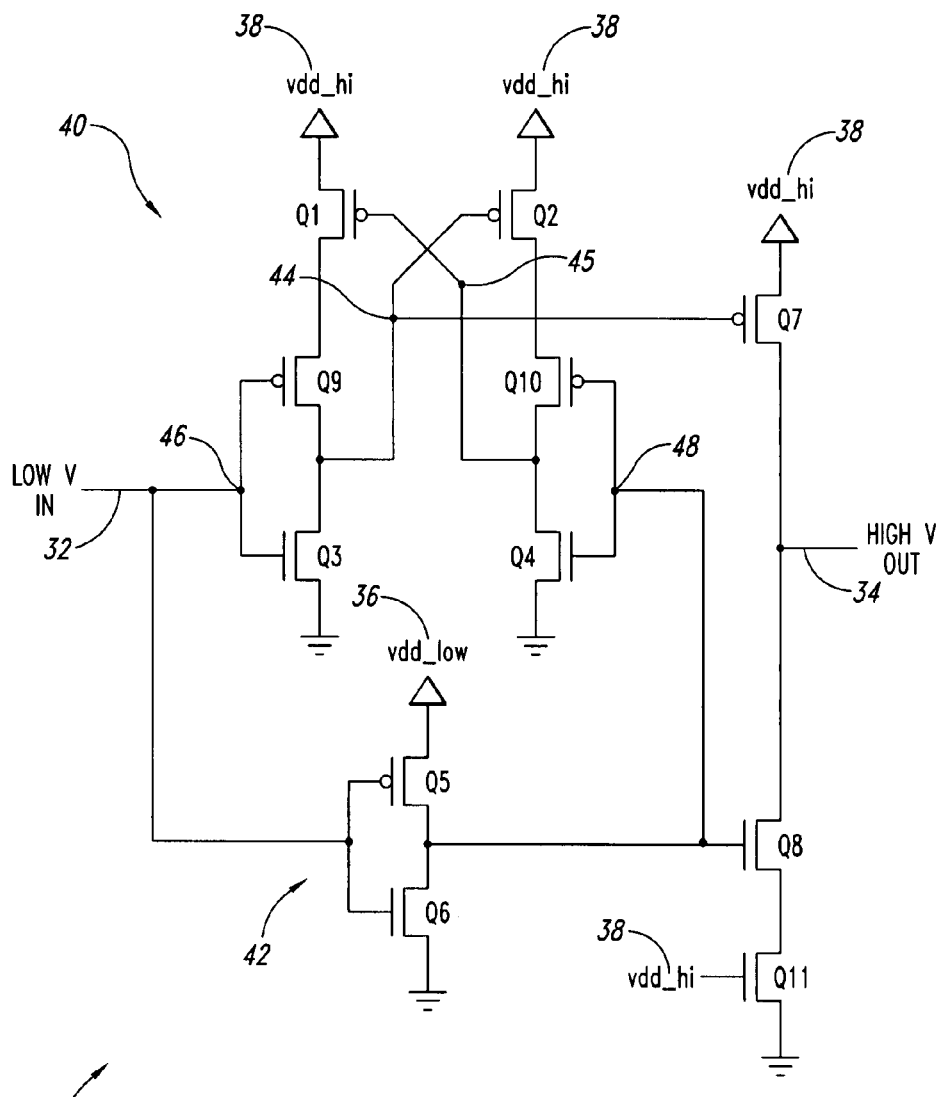
FIG. 2 illustrates a level shifting/voltage translating circuit, in accordance with an embodiment of the present invention.

Referring to FIG. 2, an example of a circuit 30 is illustrated with an input signal LOW V IN 32 that can be at a low logic level (such as 0 volts) or a high logic level such as +1.2 volts, for example. In this example, the output 34 of the circuit 30 is shown as HIGH V OUT and is at the same logic state (i.e., logic low/unasserted, or logic high/asserted) as the input signal 32 LOW V IN. As shown in FIG. 2, two supply voltages are utilized, a low voltage supply 36 shown as VDD_LOW and high voltage supply 38 shown as VDD_HI. In one example, VDD_LOW may be approximately 1.2 volts, and VDD_HI may be approximately 3.3 volts.

In the example of FIG. 2, transistors Q1, Q2, Q9, Q10, Q3, Q4 form a latch circuit 40. P-channel transistor Q1 has its source coupled with the high voltage supply 38, and p-channel transistor Q2 has its source also coupled with the high voltage supply 38. The drain of transistor Q1 is coupled with the source of p-channel transistor Q9, while the drain of transistor Q2 is coupled with the source of p-channel transistor Q10. The drain of transistor Q9 is coupled with the drain of n-channel transistor Q3, and the source of transistor Q3 is coupled with ground.

The gate of transistor Q9 is coupled with the gate of transistor Q3, which is coupled with the low voltage input signal 32. The gate of transistor Q2 is coupled with the drains of both transistors Q9 and Q3.

P-channel transistor Q10 has its drain coupled with the drain of n-channel transistor Q4, and transistor Q4 has its source coupled with ground. The drains of transistors Q10 and Q4 are coupled with each other, as shown in FIG. 2. The gate of transistor Q1 is coupled with the drains of transistors Q10 and Q4.

P-channel transistor Q5 is connected in series with n-channel transistor Q6 and form an inverter 42 of the LOW V IN signal 32. The source of transistor Q5 is coupled with the low voltage supply 36, the drain of transistor Q5 is coupled with the drain of transistor Q6, and the source of transistor Q6 is coupled with ground. The gates of transistors Q5 and Q6 are coupled with one another, and are connected with the low voltage input signal 32. The drains of transistors Q5, Q6 are coupled with the gates of transistors Q10, Q4, and are also connected with the gate of n-channel transistor Q8 which has its source coupled with the drain of n-channel transistor Q11.

Transistor Q11 has source coupled with ground, and its gate coupled with the high voltage supply 38. P-channel transistor Q7 has its source coupled with the high voltage supply 38, its gate coupled with the gate of transistor Q2 and the drains of transistors Q9, Q3, and the drain of transistor Q7 is coupled with the drain of transistor Q8.

In one example, the output 34 of the circuit 30 can be taken at the drain of transistor Q7 or the drain of transistor Q8 relative to ground, and forms a high voltage output signal 34 HIGH V OUT which is the same logical state (i.e., logic high or logic low) as the low voltage input signal 32 LOW V IN but at a higher voltage than the signal present at the low voltage input 32.

In operation, when the input signal 32 is high, transistor Q3 is on, that pulls down the gate of transistor Q2 which is also on, which places a low voltage on transistor Q7 which is the output pull-up, so that output is at VDD_HI.

The inverter 42 includes transistors Q5 and Q6, hence when the input signal LOW V IN 32 is high, the output of the inverter 42 is low, which turns off transistor Q8. Since transistor Q7 is on, the output 34 is at a high voltage via transistor Q7. Q11 is on due to the bias voltage 38 at its gate, but does not draw any significant current because transistor Q8 is off.

If the input voltage 32 is high and then it switches to a logic low, transistor Q3 turns off. However, turning transistor Q3 off does not yet switch any other transistors because the Q1/Q9 path is not yet conducting. The inverter 42 of transistors Q5, Q6 switches its output from low to high, which turns on transistor Q4 which switches the latch 40 to the opposite state. In particular, transistor Q4 turns on transistor Q1; transistor Q1 turns on transistor Q9, and the node at the gate of transistor Q2 rises which turns off transistor Q2. Hence, transistor Q2 is turned off and transistor Q9 is turned on. The gate of transistor Q7 rises which turns off the transistor Q7. At approximately the same time, transistor Q8 turns on so the output voltage then drops.

Stated differently, when the input signal 32 goes from high to low, transistor Q3 turns off, and at approximately the same time transistor Q5 of the inverter 42 turns on so the output of the inverter 42 goes high, which turns transistor Q4 on. Transistor Q4 pulls the gate of transistor Q1 low. Transistor Q9 turns on because its gate is also low. The node 44 at the gate of transistor Q2 rises, transistor Q2 turns off and also turns off transistor Q7.

In addition to transistor Q7 being turned off, transistor Q8 turns on in order to drop the output voltage 34 to a logic low level. This happens because the output of the inverter 42 went high, so at approximately the same time that transistor Q4 turned on, transistor Q8 also turns on and starts pulling down the output voltage 34.

In one example, there are two types of transistors in the circuit 30, including high voltage devices which have thicker oxide layers and low voltage core-type devices which have thinner oxide layers and are higher speed devices used for most internal circuitry.

In one example, transistors Q5, Q6 are low voltage devices so that the inverter 42 is a high speed inverter, and the other transistors may be high voltage type transistors. For instance, transistors Q3, Q4, and Q8 may be high voltage transistors and as such, these transistors do not see a full high voltage swing at their gates. VDD_LOW 36 may be the highest voltage that these transistors receive at their gate, and therefore these transistors are not fully on or fully conducting.

Since these transistors Q3, Q4, Q8 are partially on, in order to make the circuit faster, the size of transistor Q8 has to be large since it is not getting a full swing at its input. On the other hand, transistor Q7 sees a full swing at its gate from ground up to VDD_HI 38.

Hence, since transistor Q8 is only partially turned on and transistor Q7 is fully on, in order to match the rise and fall delay times on the output 34, transistor Q11 is provided with its gate tied to the high power supply 38 VDD_Hi and its drain coupled with high voltage transistor Q8.

In one example, the size of transistor Q11 matches the size of transistor Q7 so that their conductances match. Transistor Q8 can be larger than and may have a lower conductance than transistor Q11, so that when transistor Q8 turns on, transistor Q11 limits the current that transistor Q8 can conduct which makes that current match transistor Q7 in the corresponding transition.

In one example, transistors Q9 and Q10 are provided to increase or improve the speed of the level shifting circuit 30 while making the circuit less affected by integrated circuit manufacturing process variations. Transistors Q3 and Q4 override the latch 40 formed of transistors Q1 and Q2 in their cross-coupled, positive feedback configuration. To write the latch 40, in one example the strength and size of transistors Q3 and Q4 are greater than the strength of transistors Q1 and Q2.

Depending on the ratio of transistors Q3/Q1 and Q4/Q2, the speed at which the latch 40 is written can vary, and the ratios may be dependent on the manufacturing process. Through the addition of transistors Q9 and Q10, transistors Q9 and Q10 can be partially switched. For example, when transistor Q3 turns on when the input voltage 32 is high, transistor Q9 partially turns off and a reduced gate to source voltage on transistor Q9 makes it easier for transistor Q3 to turn on and to pull down node 44. The same is true for transistors Q10, Q4 at node 45. Hence, modulating the voltages on transistors Q9 and Q10 makes it easier to write the latch 40, as well as making it more consistent and less dependent on the normal manufacturing process variations.

Hence, embodiments of the present invention can make the speed and edge rates for the rise and fall of the output signal 34 less dependant on the power supply voltages, and provide low duty cycle distortion.

Figure 1:
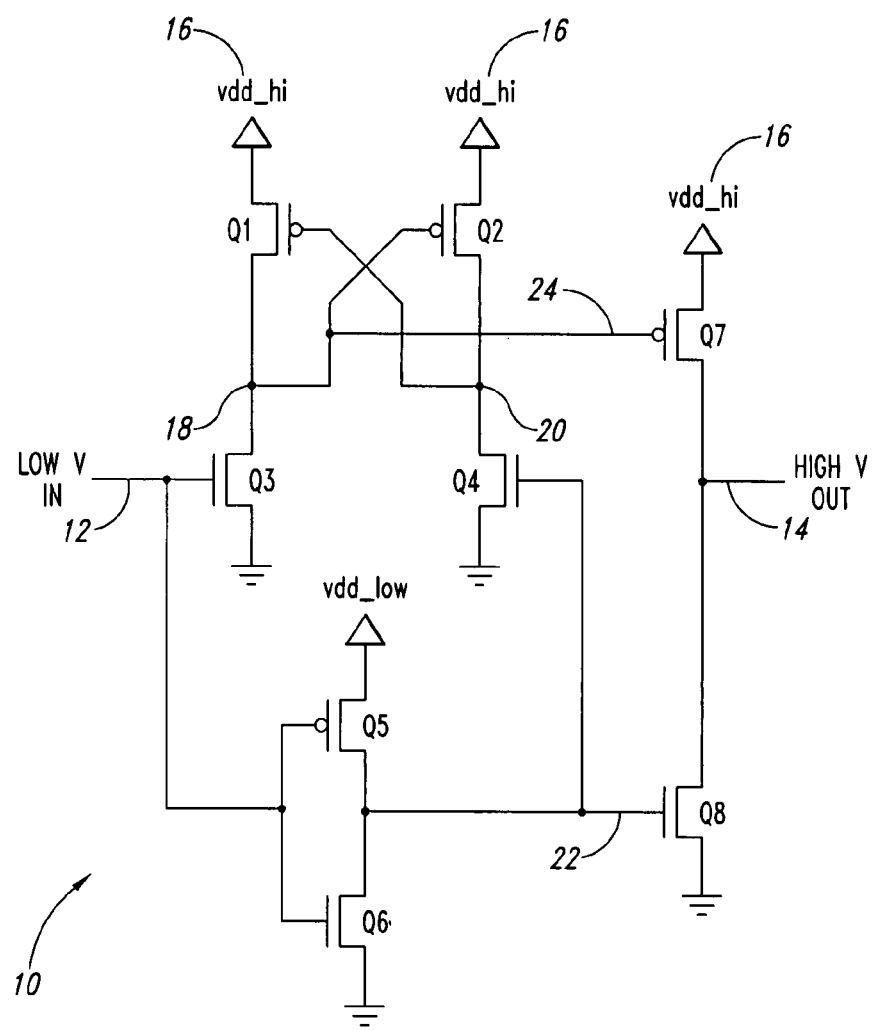
FIG. 1 illustrates a level shifting circuit for shifting the voltage level of the input signal LOW V IN to a greater level at the HIGH V OUT output.

In one example, a pull up portion of the circuit includes cross coupled p-channel transistors Q1, Q2, Q9 and Q10. N-channel transistors Q3 and Q4 will force one side or the other low, while the cross coupling will force the opposite side high. While the low voltage swing at the gates of transistors Q9 and Q10 will not force the transistors off, it will reduce their conductance making it easier for transistors Q3 and Q4 to force the circuit 30 to the opposite state. The transistors are sized such that the total pullup strength (the series combination of transistors Q1 and Q9, or Q2 and Q10) is much greater than in the circuit of FIG. 1. This allows faster rise times, faster propagation delay and lower duty cycle distortion.

Stated differently, the series p-channel transistors Q9, Q10 provide a larger pull-up conductance path to the high voltage supply 38. The series p-channel transistors Q9 and Q10 are partially switched by the low voltage input signal 32 LOW V IN or any transition in this low voltage input signal 32, and this allows a larger total pull-up conductance which results in faster rise times of the cross-coupled nodes, which provides overall improved speed for the circuit 30.

Further, series n-channel transistor Q11 in the output stage further equalizes the output 34 rise and fall times. Since the gate of transistor Q11 is connected to VDD_HI, the pull down drive strength will vary with the VDD_HI power supply 38 in a similar manner as the drive strength of p-channel transistor Q7. This prevents the voltage level of VDD_LOW from dominating the output 34 fall delay.

Hence, the series n-channel transistor Q11 added to the output stage makes the output falling edge more a function of the high voltage supply 38, which lowers the duty cycle distortion of the output of circuit. In effect, the transistor Q11 permits better matching of the output rise and fall delays, which thereby reduces the amount of distortion.

While embodiments of the present invention are described in terms of a circuit 30 which utilizes power supply levels of approximately 1.2 volts (VDD_LOW) and 3.3 volts (VDD_HIGH) and logic levels of approximately 0 volts (logic low) and +1.2 volts (logic high) shifted to approximately 0 volts (logic low) to +3.3 volts (logic high), it is understood that embodiments of the present invention can be utilized in circuits wherein the logic levels and power supply voltages are different than as described herein.

Embodiments of the present invention can be used in a variety of circuits where level shifting may be used, such as in non-volatile memory circuits, programmable logic devices, semiconductors, microprocessors or microcontrollers, logic or programmable logic devices, clock circuits, or the like.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. A circuit for shifting an input signal from a first voltage level to a second voltage level, comprising:
   a first and a second transistor that are cross-coupled;
   a third transistor having a gate coupled with the input signal, the third transistor being coupled between a gate of the second transistor and a drain of the first transistor;
   a fourth transistor having a gate coupled with an inverted version of the input signal, the fourth transistor being coupled between a gate of the first transistor and a drain of the second transistor;
   a fifth transistor coupled in series with the third transistor, said fifth transistor having a gate coupled with the gate of the third transistor; and
   a sixth transistor coupled in series with the fourth transistor, said sixth transistor having a gate coupled with the gate of the fourth transistor;
   wherein, the circuit further comprises an output stage, said output stage including:
      a seventh transistor coupled with a high voltage supply and having a gate coupled with the gate of the second transistor;
      an eighth transistor connected in series with the seventh transistor, the eighth transistor having a gate coupled with coupled with the fourth transistor; and
      a ninth transistor connected in series with the eighth transistor, the ninth transistor having a gate coupled with the high voltage supply.

2. The circuit of claim 1, wherein the first transistor is a p-channel transistor.

3. The circuit of claim 1, wherein the second transistor is a p-channel transistor.

4. The circuit of claim 1, wherein the third transistor is a p-channel transistor.

5. The circuit of claim 1, wherein the fourth transistor is a p-channel transistor.

6. The circuit of claim 1, wherein the fifth transistor is a n-channel transistor.

7. The circuit of claim 1, wherein the sixth transistor is a n-channel transistor.

8. The circuit of claim 1, wherein the eighth and ninth transistors are n-channel transistors.

* * * * *